United States Patent [19]

Harris et al.

[11] Patent Number: 5,252,907
[45] Date of Patent: Oct. 12, 1993

[54] CIRCUIT ARRANGEMENT FOR MITIGATING POWER SWITCH CAPACITANCE

[75] Inventors: William A. Harris, Coon Rapids; Arthur N. J. Pearman, St. Paul, both of Minn.

[73] Assignee: Honeywell, Inc., Minneapolis, Minn.

[21] Appl. No.: 870,852

[22] Filed: Apr. 20, 1992

[51] Int. Cl.⁵ .................... H02P 5/40; G05F 1/40; H03K 3/26
[52] U.S. Cl. .................... 323/285; 318/727; 318/254; 323/351; 307/320
[58] Field of Search ............ 318/701, 254, 439, 138, 318/727; 307/300, 319, 320; 323/285, 286, 287, 222, 351

[56] References Cited

U.S. PATENT DOCUMENTS

| | | | |
|---|---|---|---|
| 3,560,821 | 4/1969 | Beling | 318/138 |
| 4,584,506 | 4/1986 | Kaszmann | 318/701 |
| 4,609,859 | 9/1986 | Williams | 318/701 |
| 4,763,056 | 8/1988 | Byrne et al. | 318/701 |
| 5,075,610 | 12/1991 | Harris | 318/701 |

Primary Examiner—William M. Shoop, Jr.
Assistant Examiner—John W. Cabeca
Attorney, Agent, or Firm—William D. Lanyi

[57] ABSTRACT

A circuit arrangement is provided to mitigate the parasitic capacitance that typically is associated with solid state switches which are designed to carry high current magnitudes. By disposing a capacitive component in series with a power switch which, in turn, is connected in series with an inductive component, the overall capacitance of the switch and capacitive component are significantly reduced. In a preferred embodiment of the present invention, the capacitive component is a diode with a voltage potential provided at the cathode of the diode so that the parasitic capacitance of the diode can be varied to tune the total circuit for the purpose of achieving a specific resonant frequency. In applications where high frequency signals are injected into the circuit for purposes of measuring a parameter, such as rotor position, the present invention is beneficial because of the ability to tune the frequency resulting from the residence of the series LC circuit which comprises a conductive component, such as a motor stator winding, and a capacitive component, such as a power switch which possesses an inherent parasitic capacitance. Another benefit of the present invention is the fact that it makes possible the use of smaller components in a snubber network associated with the inductive component because of the increase in resonant frequency achieved by the decrease in capacitance of the series LC circuit.

16 Claims, 5 Drawing Sheets

CIRCUIT ARRANGEMENT FOR MITIGATING POWER SWITCH CAPACITANCE

BACKGROUND OF THE INVENTION

1. Field of the Invention

The present invention is generally related to a circuit arrangement for reducing the effective capacitance of a power switch and, more particularly, for reducing the effective capacitance of a power switch connected in series association with an inductor.

2. Description of the Prior Art

As is well known to those skilled in the art, the inherent characteristic of an inductive component, such as a motor winding or a relay, is that an electric current will continue to flow through the inductor after a switch connected in series with the inductor is opened for the purpose of causing current through the inductor to cease. This characteristic of inductive components is typically compensated by providing a snubber circuit (i.e. a means for dissipating the stored energy in the inductor) in parallel with the inductor. If a capacitor is connected in series with the inductor, the capacitive and inductive components combine to create a resonant circuit arrangement that can result in ringing (i.e. resonant oscillation). If the inductor is used in a circuit which is particularly sensitive to high frequencies, this ringing is particularly deleterious. In certain types of circuits, high frequency signals are injected into the circuit to pass through the inductors so that certain parameters of the circuit can be measured. The creation of high frequencies in the circuit as a result of the resonance created by the inductive and capacitive components can be particularly disadvantageous in these types of circuits.

U.S. Pat. application Ser. No. 07/658,482, which was filed on Feb. 20, 1991 by Harris and assigned to the assignee of the present application, describes a means for determining the position of a rotor in a switched reluctance motor by injecting a high frequency signal into the stator windings of the motor. The position of the rotor poles, relative to each stator pole winding, will affect the amplitude and phase of the high frequency injected signal and enable the rotor position to be determined as a function of these effects. In a circuit arrangement of this type, the switch capacitance parallels the coupling capacitor and adds to the coupling capacitance to set the resonant frequency used to determine the rotor position. The inductance of the motor winding pairs reacts with the circuit series capacitance; the intended coupling capacitors and the parasitic switch capacitance. The signal is injected into a circuit which is detuned by the operational variation of the switch capacitance. Further, the signal is divided inversely to the value of each capacitance. The signal passing through the switch capacitance is lost and thus adversely affects the signal level or signal to noise ratio of the detection process. Connecting a diode in series with this switch reduces the effective capacitance value by more than an order of magnitude.

U.S. Pat. No. 5,075,610, which issued to Harris on Dec. 24, 1991, discloses a switched reluctance motor control circuit that possesses the capability of recovering energy that would otherwise be wasted during the operation of the motor. The circuit for the switch reluctance motor is provided with a connection between a second end of each stator winding and a first end of an associated other stator winding. The purpose of this connection is to permit the flow of current from a phase winding to an energy storage device following the disconnection of the phase winding from a primary power source. Because of the inductive characteristic of the phase windings in a switched reluctance motor, the current through the winding does not immediately cease when the winding is disconnected from the power source. Instead, the inductive characteristic resists the immediate cessation of current following the opening of an associated switch. That continued current is directed to an energy storage device, such as a capacitor, for the purpose of raising the voltage at the first, or input, end of another stator winding.

U.S. Pat. No. 4,609,859, which issued to Williams on Sep. 2, 1986, discloses a conduction motor drive circuit which has a pair of windings associated with each phase of the motor, with the windings of each pair being connected in antiphase. The circuit comprises a DC supply, respective semiconductor switches in series with each motor winding for supplying current from the supply to the associated winding in only one direction and frequency control circuitry for switching the switches on and off so as to cause the winding of each winding pair to conduct current alternately and in opposite directions at a frequency which may be varied so as to change the speed of the motor.

In many applications where current flowing through an inductive component is to be switched on and off, the switching function is performed by a solid state switch. As is known to those skilled in the art, power switches have relatively high parasitic capacitances. Although field effect transistors (FET's) and insulated gate bipolar transistors (IGBT's) are usually selected for their relatively low parasitic capacitance characteristics, the use of these semiconductive devices in applications which require high current carrying capability requires that the semiconductive components comprise relatively large silicon areas which, in turn, result in relatively significant parasitic capacitances of several nanofarads. Parasitic capacitance in a semiconductor switch retards its turn off and turn on times when the switch is used in association with resistive, inductive or capacitive loads. When used in association with an inductive load, the parasitic switch capacitance combines with the inductive load to constitute a resonant circuit which must be damped by a snubber network. If the high frequency ringing that results from this combination of components is not damped, it must be tolerated during the operation of the circuit.

It would be significantly beneficial to the design of an electrical circuit arrangement, wherein a semiconductive power switch is connected in series with an inductive component, if a means is provided to mitigate the effect of the parasitic capacitance of the power switch.

SUMMARY OF THE INVENTION

The present invention provides a circuit arrangement which mitigates the otherwise deleterious affect of the parasitic capacitance of a power switch that is connected in series with an inductive component. By reducing the effective capacitance connected in series with an inductor, the resulting high frequency ringing that occurs when the switch is opened will have a much higher frequency if the capacitance is reduced. This higher resonant frequency will permit the use of much smaller components in the snubber network provided for the inductor.

In a circuit arrangement made in accordance with a preferred embodiment of the present invention, an inductive component, such as a stator winding of a motor, is connected in series with a switch and a capacitive component is connected in series between the inductive component and the switch. The switch can be a field effect transistor, an insulated gate bipolar transistor or any other switch that possesses inherent parasitic capacitances. The capacitive component connected in series between the inductive component and the switch is a diode in a preferred embodiment of the present invention.

In a particularly preferred embodiment of the present invention, a means is also provided for decreasing the voltage potential across the capacitive component when the switch is in a nonconductive, or opened, state. When the capacitive component is a diode, a voltage is provided at the cathode of the diode to reverse bias the diode for the purpose of reducing its capacitance. By adding the relatively small capacitance of the diode in series with the parasitic capacitance of the semiconductive power switch, the effective capacitance of the circuit arrangement is reduced and the resulting resonant frequency of the circuit arrangement is increased for any particular value of inductance provided the inductive component.

BRIEF DESCRIPTION OF THE DRAWINGS

The present invention will be more fully understood from a reading of the Description of the Preferred Embodiment in conjunction with the drawing, in which.

DESCRIPTION OF THE PREFERRED EMBODIMENT

Figures 1, 2:
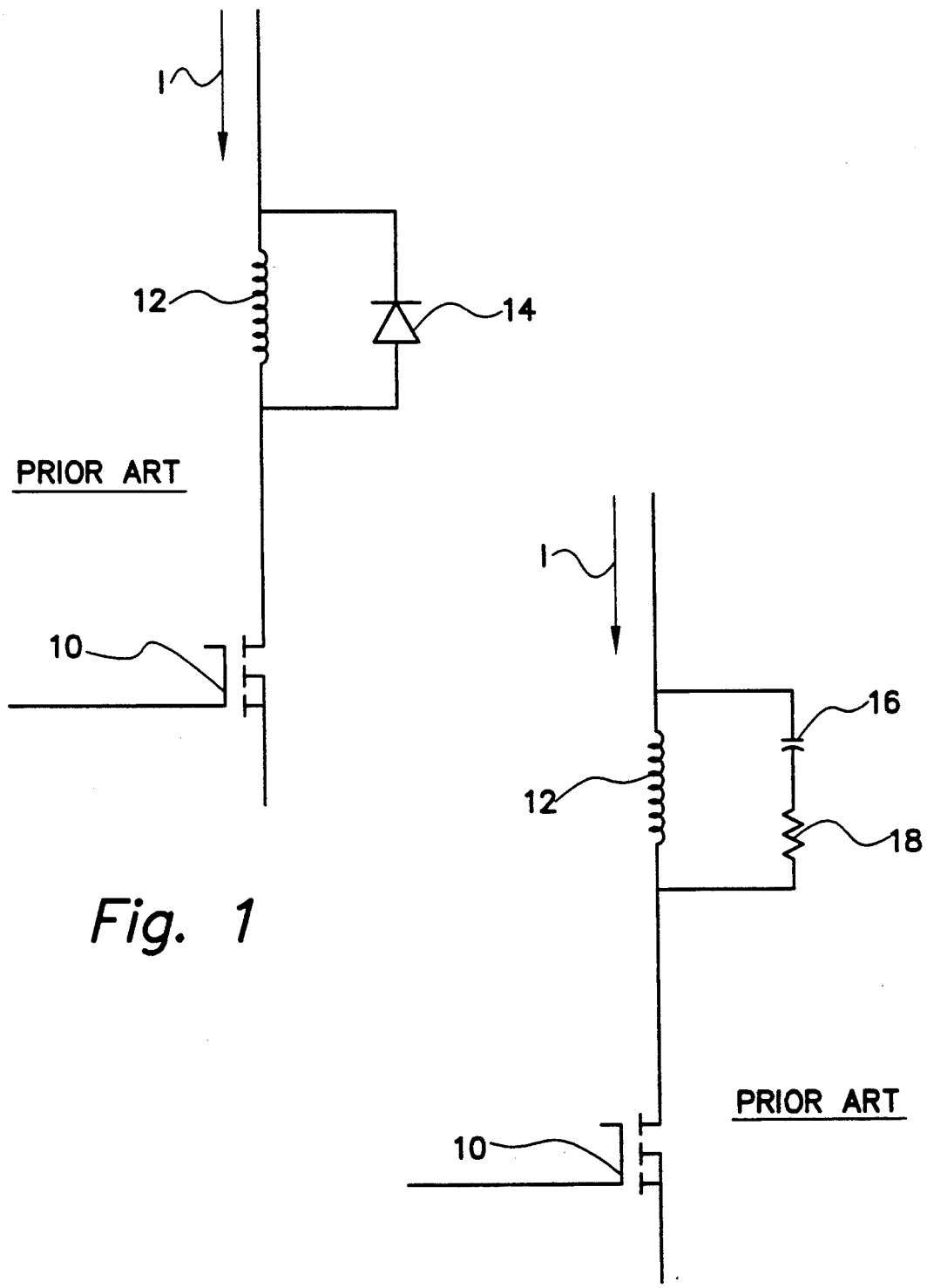
FIG. 1 and FIG. 2 show two snubber circuit arrangements generally known to those skilled in the art.

Throughout the Description of the Preferred Embodiment, like components will be identified with like reference numerals.

FIG. 1 shows a typical circuit arrangement in which a power switch 10, such as a field effect transistor, is connected in series with an inductive component 12. If a current is flowing through the circuit arrangement in a direction represented by arrow I, the inherent characteristic of the inductive component 12 is to resist the cessation of current flowing through it when switch 10 is opened. In a typical application where an inductive component is connected to a switch in this manner, a snubber circuit is usually provided in parallel with the inductive component 12. Snubber circuits can comprise a diode 14 connected in parallel with the inductive component 12 as shown in FIG. 1. Alternatively, the snubber circuit can comprise the series arrangement of a capacitor 16 and a resistor 18 which is connected in parallel with the inductive component 12 as illustrated in FIG. 2. The circuit arrangements shown in FIGS. 1 and 2 are known to those skilled in the art and are typically utilized in circuits which dispose a power switch in series with an inductive component.

Figure 3:
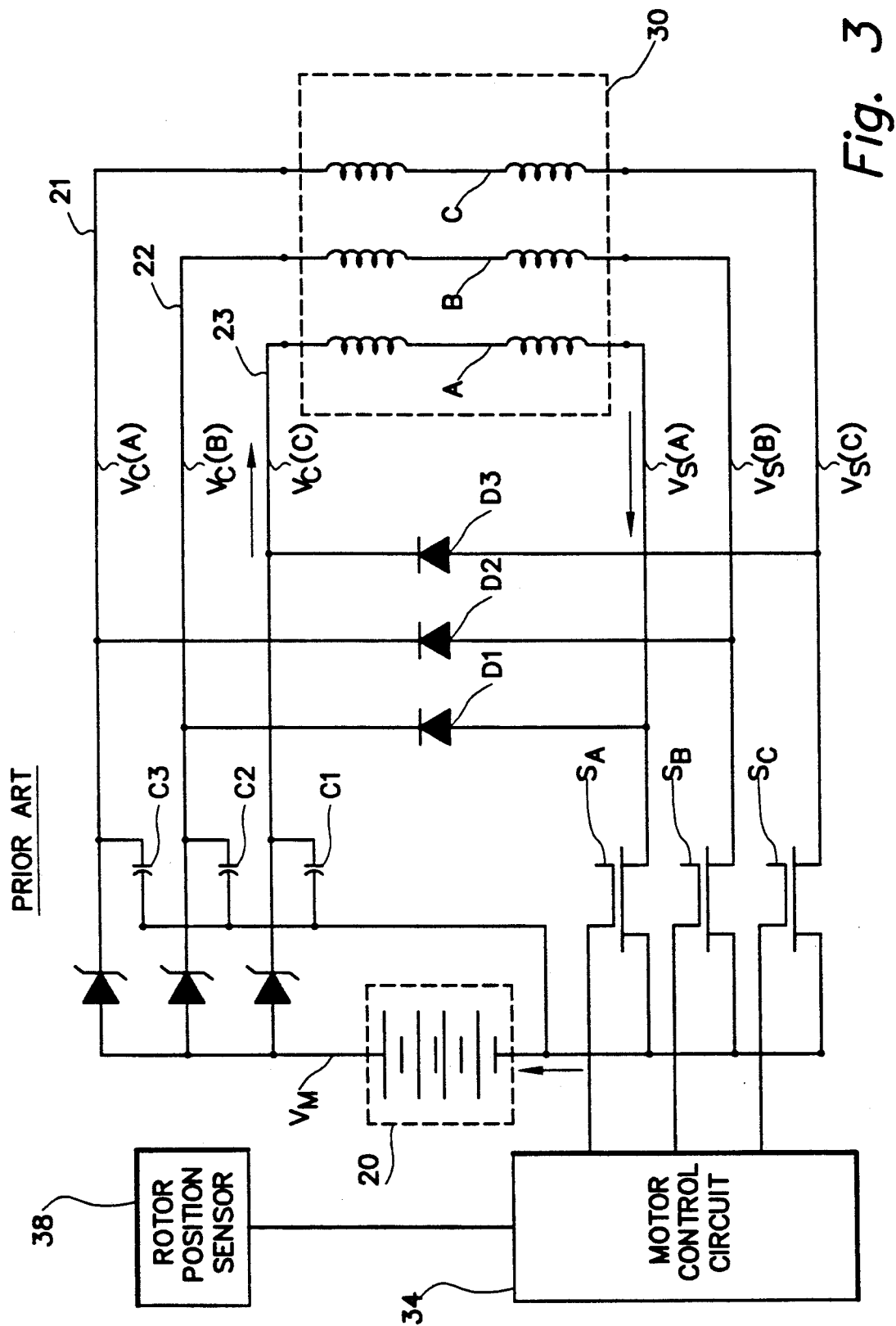
FIG. 3 shows one particular circuit that disposes a power switch in series with an inductive component.

Although there are many applications in which a power switch is connected in series with an inductive component, one particular application is in the control circuit for a motor, such as a switched reluctance motor. FIG. 3 shows a particular motor control circuit for switching the stator windings of a switch reluctance motor into and out of electrical communication with a power source. The particular circuit shown in FIG. 3 is used to permit the inherent inductive characteristics of the motor winding pairs, A, B and C, to induce the continued flow of current through the winding pairs after its related switch is opened. The current is permitted to flow to a capacitor, such as capacitors C1, C2 and C3, of another pair of stator windings for later use in increasing the initial current flow through a subsequently connected winding pair. The power source, such as the DC source 20, is connected as shown by conductive paths 21, 22 and 23 to the windings of the switched reluctance motor 30. Semiconductive power switches, $S_A$, $S_B$ and $S_C$ are controlled by motor control circuit 34 which opens and closes the power switches in response to signals received from a rotor position sensor 38. The particular operation of the circuit shown in FIG. 3 is described in greater detail in U.S. Pat. No. 5,075,610 which is hereby incorporated by reference.

As can be seen in FIG. 3, each of the semiconductive power switches is connected in series with one of the three stator windings of the switched reluctance motor 30. Therefore, when its associated semiconductive power switch is opened to deprive the winding from a completed circuit with the DC power source 20, the inherent inductive characteristic of the stator winding will attempt to continue to cause current to flow through it.

Figure 4:
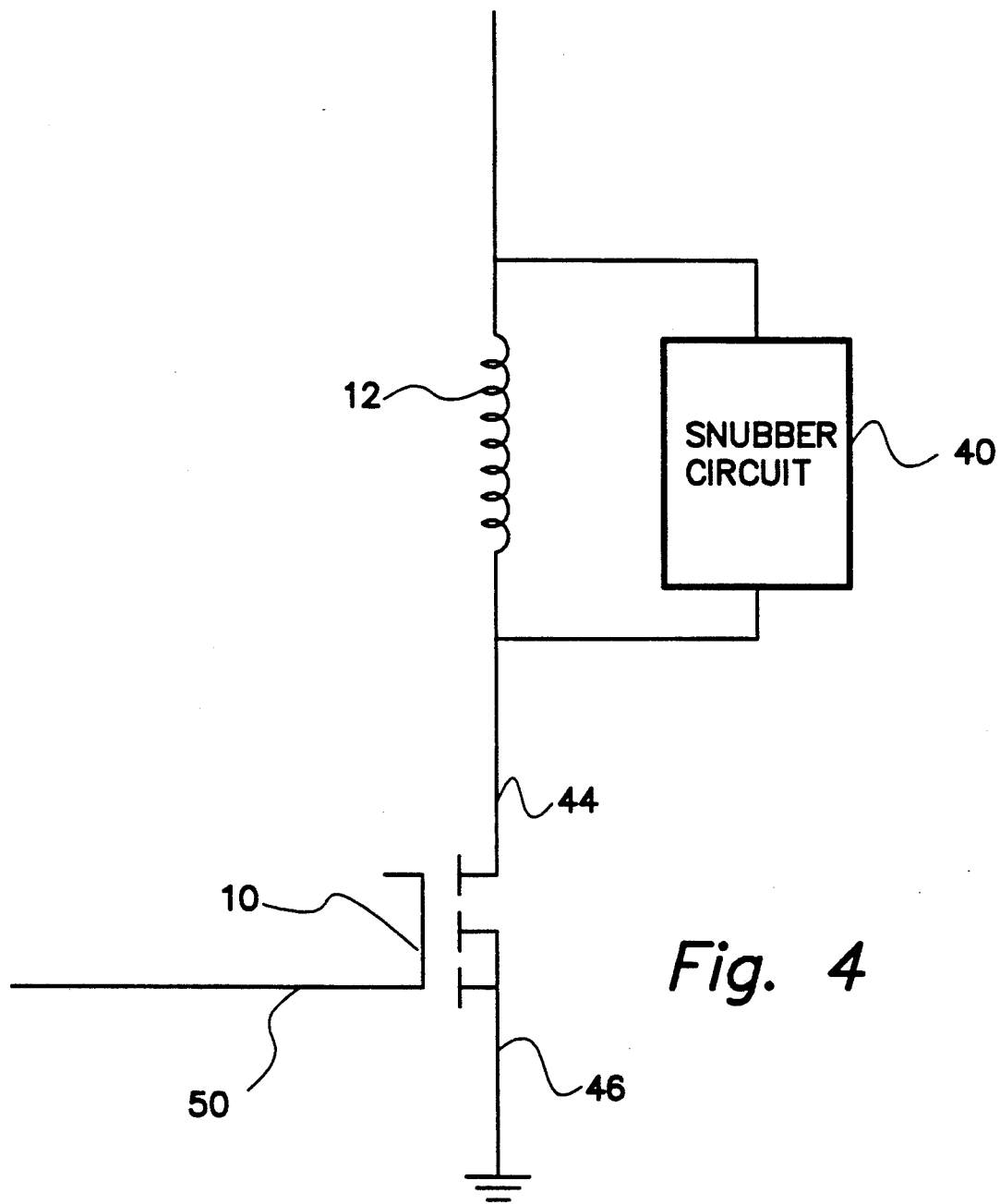
FIG. 4 shows a simplified schematic of inductive component, a power switch and a snubber circuit.

With reference to FIG. 4, a typical circuit arrangement of a power switch 10 connected in series with an inductive component 12 is shown. The inductive component 12 can be a motor winding or a part of a relay. The snubber circuit 40 is shown schematically. Reference numeral 44 is used to identify the drain connection of the power switch, reference numeral 46 is used to show the source connection of the power switch and reference numeral 50 is used to identify the gate connection of the power switch. Because of the internal structure of the semiconductive power switch 10, parasitic capacitance between the drain 44 and gate 50 exists and parasitic capacitance between the drain 44 and the source 46 exists. These two parasitic capacitances are effectively connected in parallel with each other when the gate is connected through the control circuit to ground and are therefore additive to result in a total switch capacitance that is connected in series with the inductive component 12. For the reasons described above, the inductance of the inductive component 12 and the capacitance of the power switch 10 combine to form a series resonant circuit that can result in disadvantageous ringing when the power switch is opened to stop current flowing through the inductor.

Figure 5:
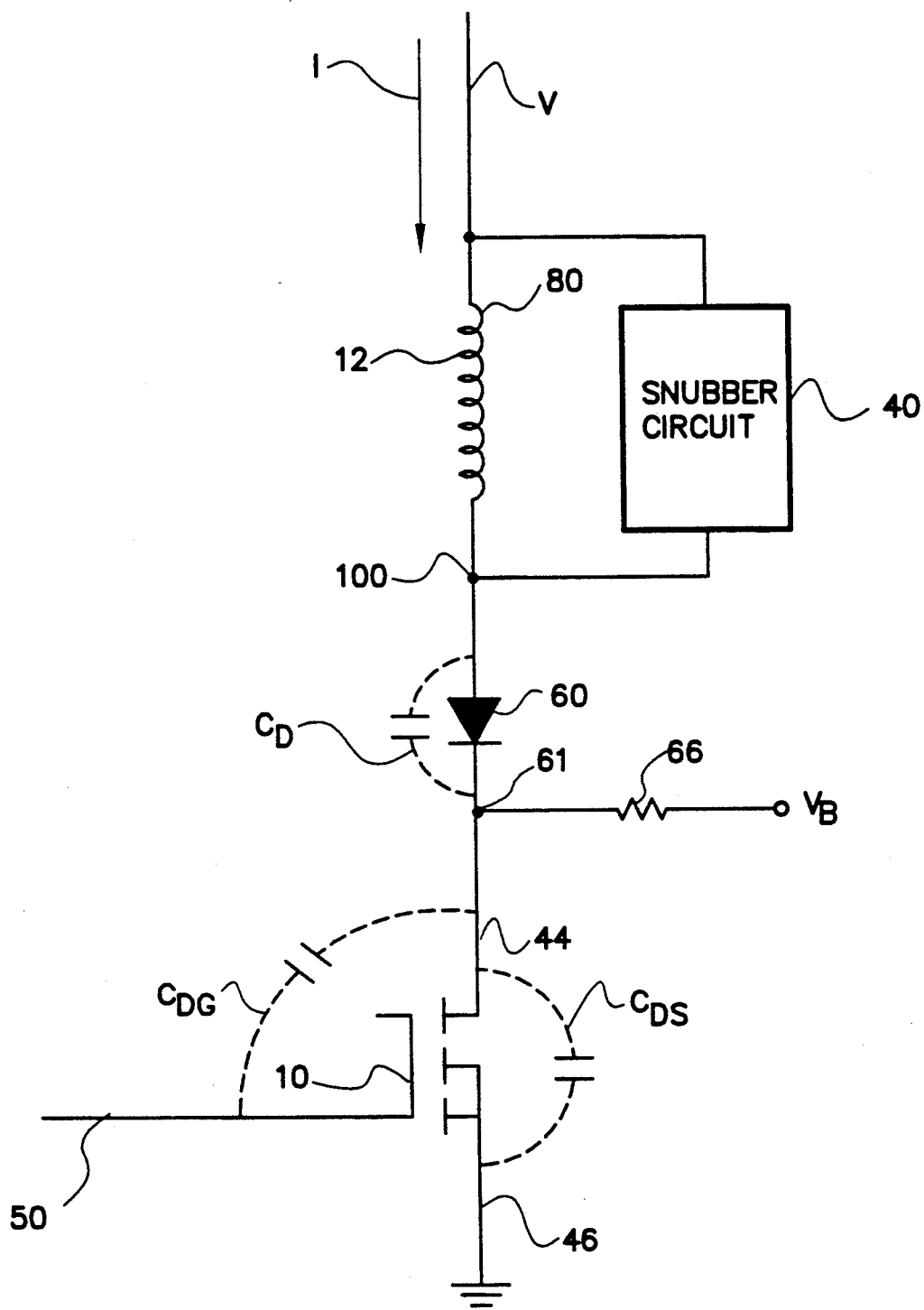
FIG. 5 shows the inclusion of the circuit arrangement of the present invention in cooperation with an inductive component, a power switch and a snubber circuit such as that shown in FIG. 4.

In order to reduce the problems associated with ringing in the circuit arrangement of an inductive component, the present invention provides an additional capacitive component in series with the power switch 10 and also provides a means for decreasing the capacitance of the additional component. With reference to FIG. 5, a preferred embodiment of the present invention disposes a diode 60 in series with the inductive component 12 and provides a voltage at the cathode 61 of diode 60 to provide a reverse bias for the diode. The provision of a reverse bias for the diode significantly reduces its effective capacitance. The cathode 61 of diode 60 is connected to a voltage source $V_B$ through a suitably sized resistor 66 to provide the reverse bias.

In FIG. 5, dashed lines are used to represent the effective capacitances of various components in the circuit. For example, the capacitance between the drain 44 and the gate 50 of power switch 10 is represented by the dashed line identified as $C_{DG}$ and the effective capacitance between the drain 44 and the source 46 of the power switch 10 is represented by the dashed line identified as $C_{DS}$. As described, these two capacitances are connected in parallel with each other and are therefore additive as represented by the following relationship:

$$C_{PS} = C_{DS} + C_{DG} \tag{1}$$

where $C_{PS}$ is the equivalent switch capacitance as seen by the load. The effective capacitance of the diode 60 is represented by the dashed line identified as $C_D$. Since the capacitance of diode 60 is connected in series with the total capacitance of the power switch 10, the two capacitances are added reciprocally to yield the effective total capacitance that is connected in series with the inductive component 12 as shown below.

$$C_T = (C_{PS} C_D)/(C_D + C_{PS}) \tag{2}$$

As described above, the provision of a voltage at the cathode of diode of 60 further decreases the capacitance of diode 60 as a result of the reverse bias on the diode. If the magnitude of voltage $V_B$ is approximately 10 volts DC greater than the voltage at the lower end 100 of the inductive component 12, a suitable decrease in the capacitance of diode 60 is realized. It should also be noted that variation of the voltage $V_B$ relative to voltage at the lower end 100 of the inductive component 12 permits the capacitance to be tuned and allows the precise matching of the capacitance value required to achieve a specific resonant frequency for the series inductive capacitive circuit comprising the inductive component 12 and the capacitive combination of the diode 60 and power switch 10.

With continued reference to FIG. 5, it should be understood that the gate connection 50 of the power switch 10 is typically connected to a motor control circuit, such as that identified by reference numeral 34 in FIG. 3, when the arrangement shown in FIG. 5 is associated with a motor and the inductive component 12 is a stator winding of the motor. In addition, it should be understood that the voltage source connected to the lower end 100 of inductive component 12 is typically a battery, such as that identified by reference numeral 20 in FIG. 3, or some other suitable power source that is capable of providing a DC voltage potential V at the upper end of the inductor.

Figure 6:
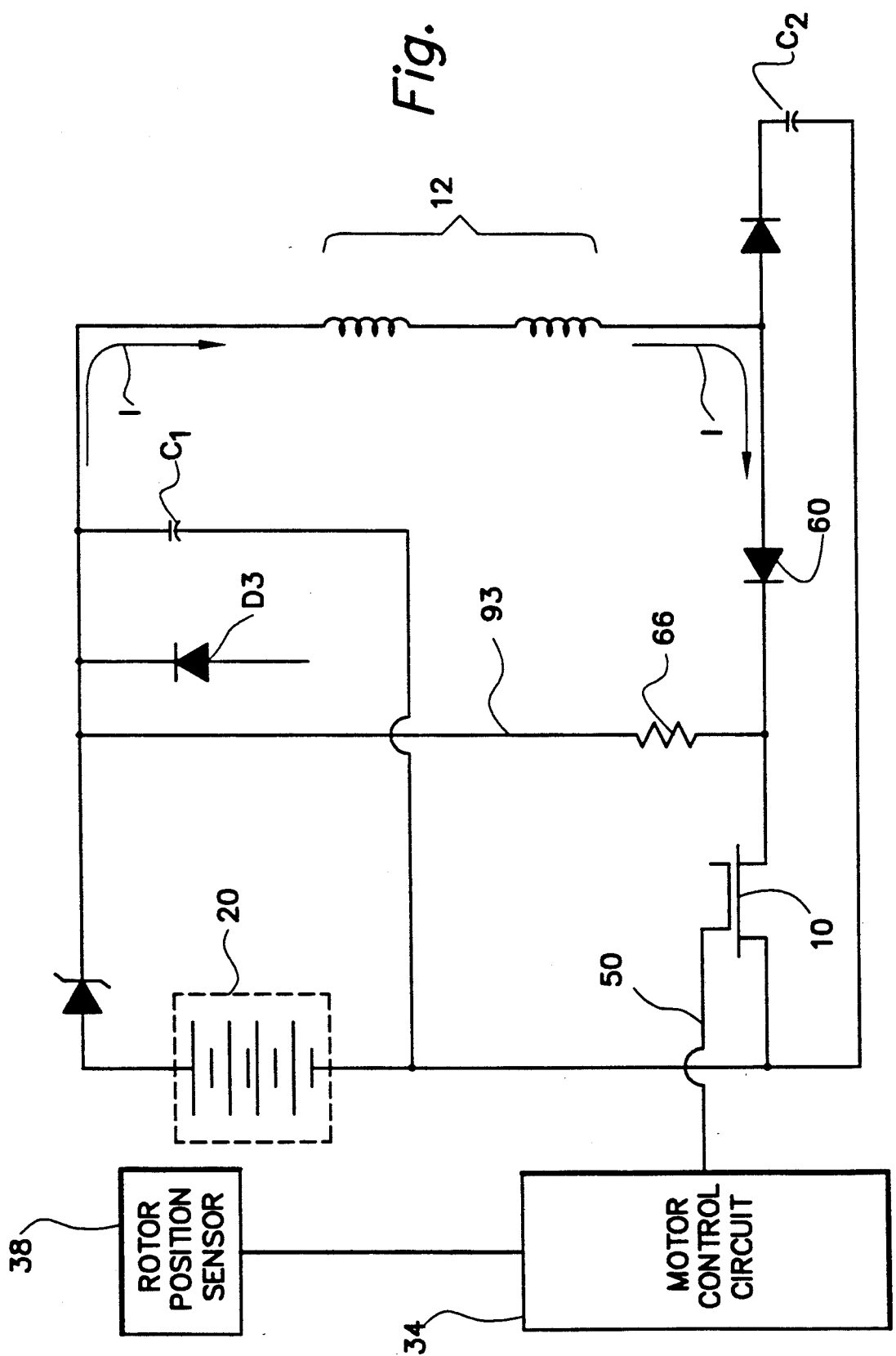
FIG. 6 illustrates a particular arrangement of a motor control circuit in which the present invention is included.

FIG. 6 shows one embodiment of the present invention applied to a motor control circuit as shown in FIG. 3. One combined stator winding, which is identified as conductive component 12, is connected to a DC power source 20 with one end of the inductive component 12 being switchably connected to the ground terminal of the power source. Power switch 10 provides the ability to connect and disconnect the inductive component 12 from the power source. The motor control circuit 34 is connected to the gate connection 50 of the power switch 10 and operates in response to signals received from a suitable rotor position sensor 38. When the power switch 10 is closed, current flows from the DC power source 20 through the inductive component 12 as indicated by arrows I. When the power switch 10 is opened to discontinue the current through the inductive component, line 93 connects the cathode end of diode 60 to a source of DC voltage potential through resistor 66 which is above that of the anode and of diode of 60. This reverse bias operates to substantially reduce the parasitic capacitance of the diode 60 as described above. This reduced capacitance of diode 60, which is connected in series with the effective capacitance of the power switch, significantly reduces the total capacitance connected in series with the inductor. This reduction in capacitance, for a specific value of inductance connected in series with it, raises the resonant frequency of the combined series LC circuit.

Although the present invention has been described with significant specificity and illustrated to disclose a particular application of one embodiment of the present invention, it should be understood that alternative embodiments and alternative applications are within the scope of the present invention.

The embodiments of the invention in which an exclusive property or right is claimed are defined as follows:

1. A circuit arrangement, comprising:
   an inductive component;
   a switch connected in series with sad inductive component;
   a capacitive component connected in series with said inductive component and said switch, said capacitive component being a diode; and
   means for raising the voltage potential at the cathode of said diode above the voltage potential of the anode of said diode when said switch is nonconducting.

2. The circuit arrangement of claim 1, wherein:
   said switch is a field effect transistor.

3. The circuit arrangement of claim 1, wherein:
   said switch is an insulated gate bipolar transistor.

4. The circuit arrangement of claim 1, wherein the anode of said diode is connected to said inductive component.

5. The circuit arrangement of claim 1, wherein:
   said switch is connected between said capacitive component and a point of ground potential.

6. The circuit arrangement of claim 1, wherein:
   said inductive component is a stator winding of a motor.

7. The circuit arrangement of claim 1, wherein:
   said inductive component is a relay.

8. A circuit arrangement, comprising:
   an inductive component;
   a switch connected is series with said inductive component;
   a diode connected in series with said inductive component and said switch; and
   means for raising the voltage potential of the cathode of said diode above the voltage potential of the anode of said diode in response to an opening of said switch.

9. The circuit arrangement of claim 8, wherein:
   the anode of said diode is connected to said inductive component.

10. The circuit arrangement of claim 9, wherein:
    said switch is connected between said capacitive component and a point of ground potential.

11. The circuit arrangement of claim 10, wherein:
said inductive component is a stator winding of a motor.

12. The circuit arrangement of claim 11, wherein:
said motor is a switched reluctance motor.

13. The circuit arrangement of claim 10, wherein:
said inductive component is a relay.

14. The circuit arrangement of claim 12, wherein:
said switch is an insulated gate bipolar transistor.

15. A circuit arrangement, comprising:
an inductive component;
a solid state switch connected in series with said inductive component;
a diode connected in series between said inductive component and said switch, the anode of said diode is connected to said inductive component, said switch being connected between said diode and a circuit point of ground potential; and
means for reverse biasing said diode when said switch is not fully conductive between said diode and said point of ground potential.

16. The circuit arrangement of claim 15, wherein:
said inductive component is a stator winding of a switched reluctance motor.

* * * * *

UNITED STATES PATENT AND TRADEMARK OFFICE
CERTIFICATE OF CORRECTION

PATENT NO. : 5,252,907

DATED : October 12, 1993

INVENTOR(S) : William A. Harris and Arthur N. J. Oearman

It is certified that error appears in the above-indentified patent and that said Letters Patent is hereby corrected as shown below:

On the title page, item [54] and in column 1, line 1, in the title please delete "MITIGRATING" and substitute therefor --MITIGATING--.

Signed and Sealed this

Seventh Day of June, 1994

Attest:

BRUCE LEHMAN

*Attesting Officer*     *Commissioner of Patents and Trademarks*